United States Patent [19]
Yamanaka

[11] Patent Number: 5,641,714
[45] Date of Patent: Jun. 24, 1997

[54] METHOD OF MANUFACTURING MEMBERS

[75] Inventor: Hideo Yamanaka, Kanagawa, Japan

[73] Assignee: Sony Corporation, Tokyo, Japan

[21] Appl. No.: 585,776

[22] Filed: Jan. 16, 1996

[30] Foreign Application Priority Data

Jan. 17, 1995 [JP] Japan .................................. 7-004576

[51] Int. Cl.⁶ ........................................... H01L 21/302
[52] U.S. Cl. ........................ 438/14; 438/464; 438/977
[58] Field of Search ........................ 437/6, 226, 227, 437/524, 574; 148/DIG. 28, DIG. 135

[56] References Cited

U.S. PATENT DOCUMENTS 5,270,260  12/1993  Scheuenpflug ............................ 437/226
5,362,681  11/1994  Roberts, Sr. et al. .................... 437/524

FOREIGN PATENT DOCUMENTS 58-60529  4/1983  Japan ..................................... 437/524

*Primary Examiner*—Kevin Picardat
*Attorney, Agent, or Firm*—Hill, Steadman & Simpson

[57] ABSTRACT

According to the present invention, a method of manufacturing members, with a plurality of members being formed together on a single substrate and the substrate being cut in such a manner as to be divided into individual members after a characteristic evaluation of the members is carried out, comprises the steps of, carrying out the evaluation of the characteristics and applying ink marks of a prescribed height to surfaces of members deemed to have been defective, affixing a protective tape having an adhesive layer of a thickness equal to or greater than the height of the ink marks, to the surface of the substrate and cutting the substrate in such a manner as to be divided into individual members after a lower surface of the substrate has been ground or polished.

7 Claims, 4 Drawing Sheets

METHOD OF MANUFACTURING MEMBERS

BACKGROUND OF THE INVENTION

The present invention relates to a method of manufacturing members where semiconductor chips or other members are cut out from a substrate.

Conventionally, in the manufacture of semiconductor devices such as discrete transistors, bipolar integrated circuits (hereinafter referred to as "IC's"), metal oxide semiconductor (MOS) IC's and compound semiconductor devices etc., Charge Coupled Device (hereinafter referred to as "CCD's") light receiving elements for CCD area sensors/linear sensors, and optical filters etc., large numbers of members such as chips or filters etc. have been collectively manufactured from a single substrate.

For example, with semiconductor devices and CCD devices, large numbers of chips have been manufactured taking silicon wafers as substrates, while with optical filters, large numbers of filters have been manufactured taking boro-silicated glass or quartz glass plates as the substrates.

Whichever members are manufactured, the characteristics etc. of each of the members are to be evaluated via an inspection process before the large number of members formed on the substrate are cut out, to determine whether or not members are defective. An ink mark is then applied to a member when this member is deemed to be defective.

In the case of semiconductor devices or CCD devices, from the point of view of achieving thinness in the integrated circuits, the lower surface of the wafer is gradually ground before cutting out so as to thin-out the overall thickness. With filters, the lower surface is polished to remove debris that may have become attached to this lower surface and to remove any damage incurred.

However, with this kind of method of manufacturing a member, when an evaluation inspection of the characteristics etc. is carried out after the lower surface has been ground etc., cracking or breaking off occurs in the substrate as a result of pin pressure during characteristic measurements or impacts at the time of physical distribution. The substrate can be made extremely thin, however, as a result of grinding, but as the size of substrates has progressed in recent years, this cracking etc. has become more striking.

Further, grinding the lower surface after the evaluation inspection has been carried out has been considered, but in this case, if defective members are applied with ink marks, pressure exerted on the lower side of the substrate during subsequent lower surface grinding etc. is concentrated on the members via the ink marks to cause the members to crack. This is due to the applied ink marks elevated from the surface of the substrate to make the surface nonuniform and the pressure during grinding is concentrated to act onto the substrate from the positions of the ink marks depending mainly on the height and hardness of the ink marks and the hardness of the protective tape attached to the surface of the substrate during the grinding of the lower surface.

To solve this, rather than applying ink marks to defective members during evaluation inspection, a method was considered where information pertaining to defective members was recorded on a floppy disc etc. as map data. However, if the evaluated information was recorded a medium other than the substrate, it was necessary to transport the substrate together with the medium for carrying out subsequent processes such as, for example, die bonding. Further, defect determination data could not be accurately played back as a result of mistakes made when inputting the map data and the inability not to be able to make a match with substrate member positions. A large-scale data management system was therefore necessary to enable defect determination information to be reliably reproduced.

SUMMARY OF THE INVENTION

The present invention is therefore a method of manufacturing members that sets out to solve these kinds of problems.

According to the present invention, a method of manufacturing members, with a plurality of members being formed together on a single substrate and the substrate being cut in such a manner as to be divided into individual members after a characteristic evaluation of the members is carried out, comprises the steps of, carrying out the evaluation of the characteristics and applying ink marks of a prescribed height to surfaces of members deemed to have been defective, affixing a protective tape having an adhesive layer of a thickness equal to or greater than the height of the ink marks, to the surface of the substrate and cutting the substrate in such a manner as to be divided into individual members after a lower surface of the substrate has been ground or polished.

The adhesive strength of the adhesive layer for the protective tape may be smaller than the adhesive strength of the ink marks with respect to the substrate.

Further, according to the present invention, a method of manufacturing members, with a plurality of members being formed together on a single substrate and the substrate being cut in such a manner as to be divided into individual members after a characteristic evaluation of the members is carried out, comprises the steps of carrying out the evaluation of the characteristics and applying ink marks of a prescribed height to surfaces of members deemed to have been defective, affixing a self-peeling protective tape, having an adhesive layer of a thickness equal to or greater than the height of the ink marks, to the surface of the substrate, cutting the substrate together with protective tape so as to divide the substrate into individual members after a lower surface of the substrate has been ground or polished with the protective tape affixed and applying a prescribed energy to each individual member after dividing, in such a manner that the protective tape is made to peel itself off.

The self-peeling protective tape may peel itself in response to thermal energy.

The adhesive layer of the protective tape may be an ultra-violet curing type, a thermal foam peeling type or a surface active agent-containing type.

According to the present invention, after ink marks have been applied to the surfaces of members that have been deemed to be defective in the characteristic evaluation, a protective tape having an adhesive layer of a thickness equal to or greater than the thickness of the ink mark is applied. In this way, the ink marks are buried in the adhesive layer and the protective tape is flat with respect to the surface of the substrate. Because of this, even if grinding or polishing of the lower surface of the substrate is carried out with the adhesive tape affixed, pressure applied from the lower surface of the substrate at this time is distributed evenly over the whole of the surface of the protective tape. This pressure is therefore not concentrated on the ink mark portion and localized concentration of the load at the substrate is avoided.

Moreover, by using a self-peeling protective tape, after the substrate has been divided up with the protective tape still in place, the protective tapes can be individually self-peeled by supplying a prescribed amount of energy to each individual member after dividing. Still further, the members can be transported for processes after dividing with the protective tape still attached because the protective tape can be easily peeled even after the individual members have been divided-up. This means that the period for which damage to the surfaces of the members is prevented and the period for which the attaching of debris to the surfaces of the members is prevented is made long.

DETAILED DESCRIPTION OF THE PREFERRED EMBODIMENTS

First Embodiment

The following is an embodiment, based on the drawings, of a method of manufacturing members according to the present invention.

Figure 1A:
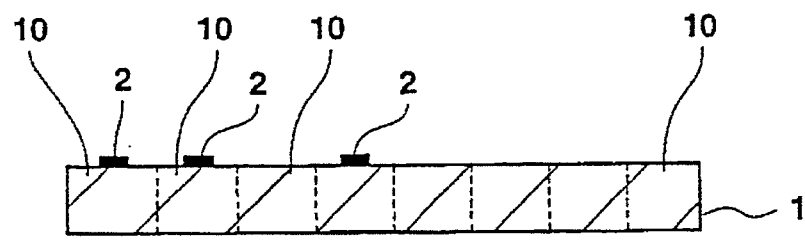
FIG. 1A through FIG. 1C are schematic cross-sectional views illustrating a first representative of a first embodiment of the present invention.
Figure 1B:
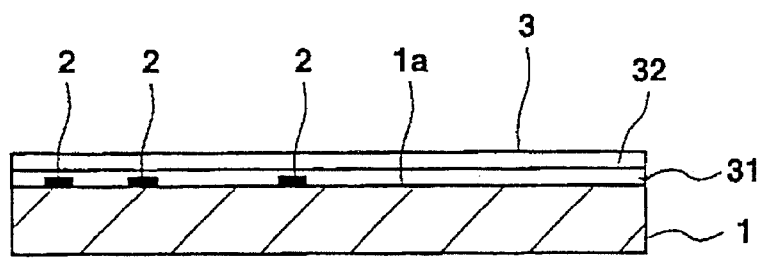
Figure 1C:
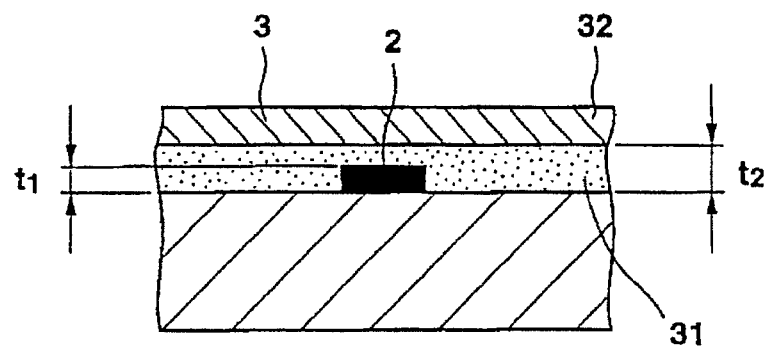
Figure 2A:
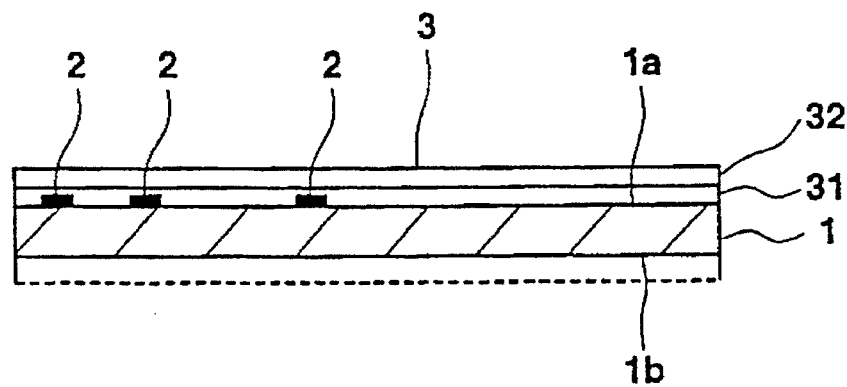
FIG. 2A through FIG. 2C are schematic cross-sectional views illustrating a second representative of the first embodiment of the present invention.
Figure 2B:
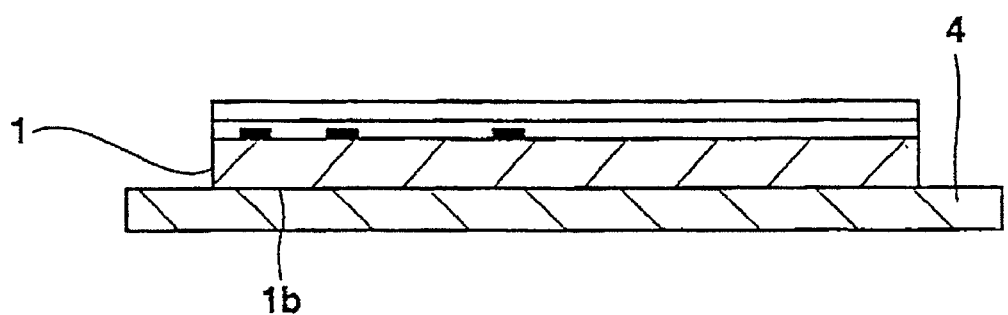
Figure 2C:
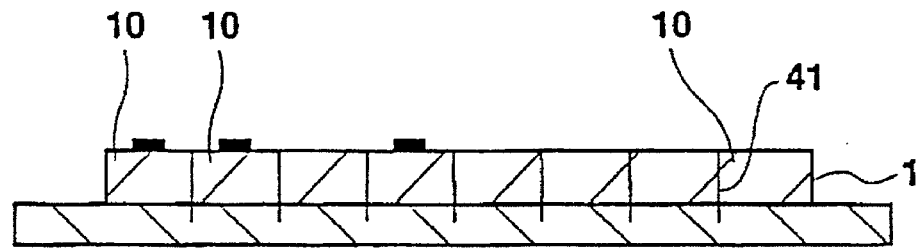

FIG. 1A through FIG. 1C are schematic cross-sectional views illustrating a first representative of a first embodiment of the present invention and FIG. 2A through FIG. 2C are schematic cross-sectional views illustrating a second representative of the first embodiment.

The members 10 to be made according to this embodiment are, for example, silicon or compound semiconductor chips such as discrete transistors, bipolar IC's or MOS IC's, photomic devices such as CCD area sensors, CCD linear sensors, lasers or photodiodes or optical filters etc. used in LCD's (liquid crystal devices). A substrate 1 may be a silicon wafer, a compound semiconductor wafer, an optical substrate, an optical glass plate or a quartz glass plate.

In any one of the above, the object of manufacture is a plurality of members 10 manufactured by dividing-up a single layer substrate 1.

First, in this first embodiment, the characteristics of the plurality of members 10 formed from the substrate 1 are evaluated, with ink marks being applied at the members for which the characteristics are evaluated to be unsuitable, as shown in FIG. 1A.

During this time, the substrate 1 is of a thickness that ensures that cracking or breaking off due to the application of a prescribed pin pressure does not occur.

As the substance for the ink mark 2, for example, a substance having resol resin as a main component is used which hardens due to heating (for 20 minutes to one hour at a temperature of 150 degrees centigrade), and is applied to a height of, for example, 20 μm or less. Further, an oil based fast-drying ink may also be used.

Next, a protective tape 2 is affixed on a surface 1a of the substrate 1 that has been applied with the ink marks 2, as shown in FIG. 1B.

This protective tape 3 is constructed from, for example, an acrylic fiber ultra-violet curing adhesive layer 31 and a polyolefine fiber base material film 32. The base material film 32 is approximately 110 μm thick and the thickness of the adhesive layer 31 is set to be equal to or greater than the thickness of the ink marks 2 applied to the surface 1a of the substrate 1. FIG. 1C is an enlarged view of the affixed portion of the protective tape 3. For example, if the thickness of the ink mark is taken to be t1 and the thickness of the adhesive layer 31 is taken to be t2, then t1 is set to be less than or equal to t2. In this way, when the protective tape 3 is being affixed, the ink marks 2 are buried within the adhesive layer 31 and the surface of the base material film 32 can be made flat.

Further, by making the thickness t2 of the adhesive layer 31, for example, 25 μm when the thickness t1 of the ink marks is, for example, 20 μm, an adhesive layer 31 of thickness 5 μm remains between the ink mark 2 and the base material film 32. This adhesive layer 31 is served as a pressure buffering material during the grinding of the lower surface of the substrate 1 in a later process.

Next, the process for grinding the lower surface 1b of the substrate 1 is carried out, as shown in FIG. 2A. The previously described protective tape 3 is affixed to the surface 1a of the substrate 1. The lower surface side of the substrate 1 is then pressed against a grinding wheel (not shown in the drawings) under these conditions and grinding of the lower surface of the substrate 1 is carried out. This grinding is a process known as back grinding and is necessary for making the substrate 1 thin. Further, at the grinding of the lower surface of the substrate 1, the surface of this protective tape 3 is flat because the protective tape 3 is affixed on the surface 1a of the substrate 1 and the thickness of the adhesive layer 31 is equal to or greater than the thickness of the ink marks 2.

With this so-called "back grinding", when pressure is exerted by the grinding wheel (not shown in the drawings) against the lower surface of the substrate 1, a uniform grinding pressure is exerted on the surface of the substrate 1 and the generation of cracking and breaking off in the substrate 1 is suppressed.

When the thickness of the adhesive layer 31 is made to be thicker than the thickness of the ink marks 2, the adhesive layer 31 between the ink marks 2 and the base material film 32 serves as a buffer material and the application of pressure from the ink marks 2 to the substrate 1 in a concentrated manner can be suppressed. In the case of, for example, a silicon wafer 6 inches in diameter and 620 μm in thickness, a thinness of 200 μm to 250 μm can be achieved as a result of this grinding of the lower surface of the substrate 1.

After the lower surface of the substrate 1 has been ground, the adhesive layer 31 for the protective tape 3 is irradiated with, for example, 1000 mJ/cm² of ultra-violet light so as to be hardened. By applying the adhesive layer 31 that hardens due to irradiation with ultra violet light so that the adhesive strength is lowered, the protective layer can be peeled away in the following steps without any adhesive remaining. Washing of the substrate 1 is therefore not necessary because the protective tape 3 can be peeled off without any adhesive remaining and it is therefore no longer necessary to take into consideration peeling of the ink mark 2 due to washing.

Under these conditions, the substrate 1 is transported and the next dicing process is proceeded with. The protective tape 3 prevents dust from sticking and damage from being incurred while the substrate 1 is being transported.

Next, a dicing tape 4 is applied to the lower side 1b of the substrate 1 for carrying out the dicing process, as shown in FIG. 2B.

When the substrate 1 is being diced, the protective tape 3, whose adhesive layer 31 has been hardened for lowering the adhesive strength in the previous process, is peeled off. The protective tape 3 may also be peeled off before the dicing tape 4 is adhered to the substrate 1, depending on the relationship with the dicing apparatus, etc.

Peeling off of the ink marks 2 together with the protective tape 3 while the protective tape 3 is being peeled off may be prevented by making the adhesive strength of the adhesive layer 31 for the protective tape 3 smaller than the adhesive strength with which the ink marks 3 are fixed to the substrate 1.

Next, a dicing process is carried out where the substrate 41 is cut (for example, full-cut) along scribe lines 41, as shown in FIG. 2C so as to divide the substrate 1 into individual members 10.

The members of the members 10 that have not been applied with an ink mark 2 (non-defective) are then detected by an image processing device employing a CCD (charge-coupled device) camera and picked-up. When the members 10 are semiconductor chips, is picked-up a non-defective member 10 by a die bonder to carry out bonding, for example, to a lead frame die pad (not shown in the drawings).

According to this kind of manufacturing method, the members 10 can be made thin without the occurrence of cracking or breaking off even when defective or non-defective identification is made with an ink mark method.

A base material film 32 for the protective layer 3 applied to the first embodiment may be the one that is self-peeled as a result of receiving a prescribed energy. Further, the adhesive layer 31 may be comprised of a thermal foam peeling material or surface active agent-containing material other than an ultra-violet curing material.

Figure 3A:
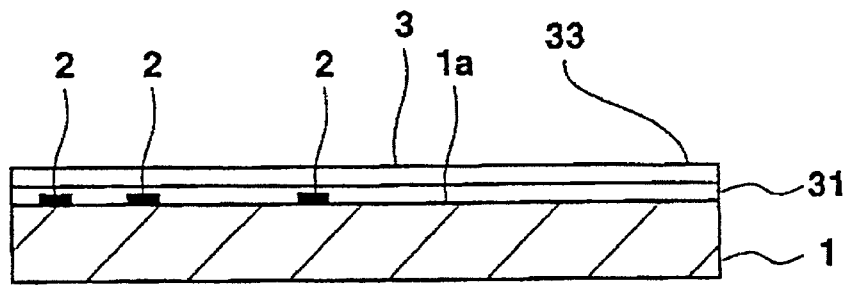
FIG. 3A through FIG. 3C are schematic cross-sectional views illustrating a first representative of a second embodiment of the present invention.
Figure 3B:
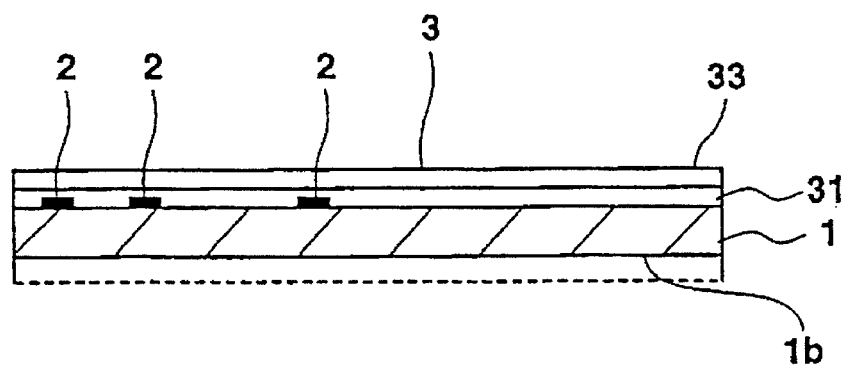
Figure 3C:
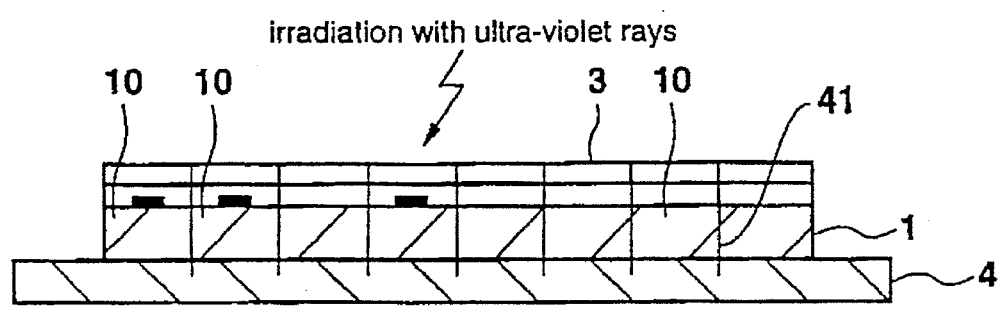
Figure 4A:
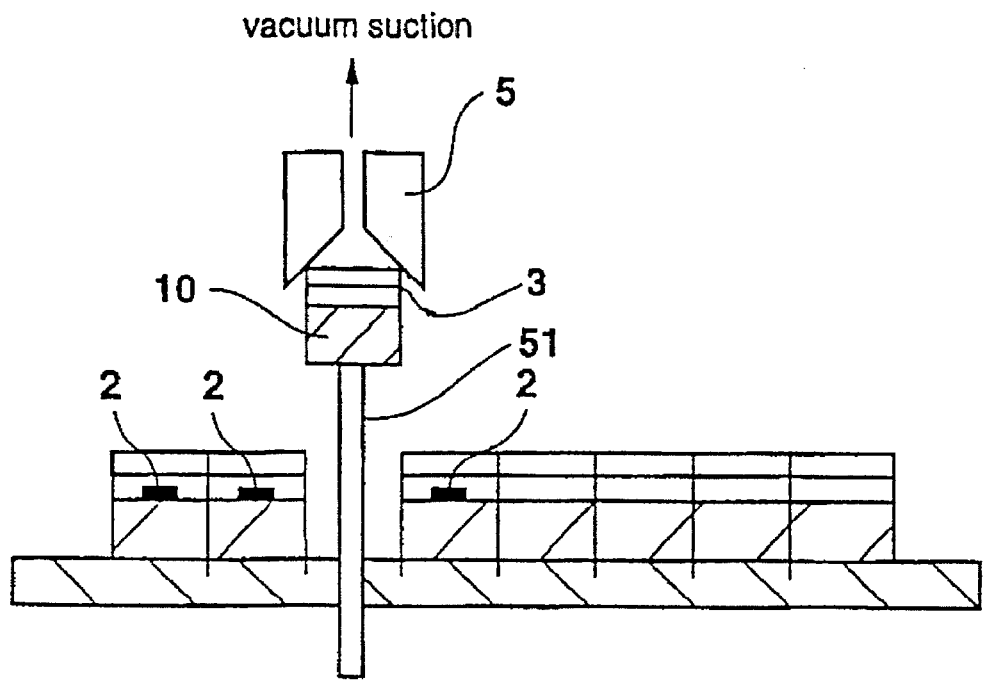
FIG. 4A and FIG. 4B are schematic cross-sectional views illustrating a second representative of the second embodiment of the present invention.
Figure 4B:
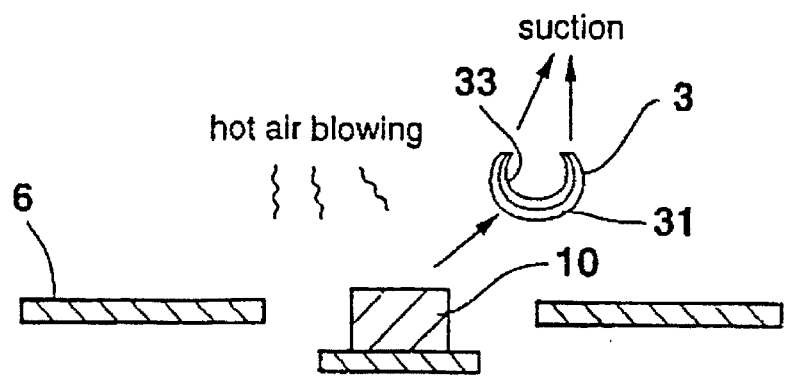

Next, a manufacturing method for members for a second embodiment of the present invention will be described. FIG. 3A through FIG. 3C are schematic cross-sectional views illustrating a first representative of the second embodiment and FIG. 4A and FIG. 4B are schematic cross-sectional views illustrating a second representative of the second embodiment.

The target of the manufacturing in this second embodiment is the members 10 and the substrate 1 used in the manufacturing is the same as for the first embodiment.

First, in this second embodiment, the characteristics of the plurality of members 10 formed on the substrate 1 are evaluated. Ink marks are then applied to members that are deemed to be defective and a protective tape 3 is then stuck onto the surface 1a of the substrate 1 as shown in FIG. 3A.

A resin for which, for example, a resol resin is the main component, that hardens as a result of heating (at 150° C. for 20 minutes to one hour) is used for the ink marks 2, and is applied, for example, to a height of 20 μm or less.

The protective tape 3 of the second embodiment comprises, for example, an ultra-violet curing acrylic fiber adhesive layer 31 and a self-peeling backing material film 33. As the self-peeling backing material film 33, for example, thermally shrinkable polyolefine fiber of a thickness of about 40 μm that can be shrank and peeled at a temperature of 70° to 80° C. is taken.

In the case of a thermal foam peeling tape, a polyolefine fiber or polyester fiber backing material film 33 with a thickness of, for example, about 80 μm is used with micro capsules (not shown in the drawings) of 5 to 15 mm in size being mixed within the acrylic fiber adhesive layer 31.

With this thermal foam peeling tape, gas (for example, an isobutane group gas) sealed inside the capsules is expanded (to a volume a few tens of times the size) by heating to swell the micro capsules. In this way, the adhesive strength of adhesive layer 31 is lowered to make the tape peel by itself from the affixing object. The amount of residual adhesive left on the affixing object after self-peeling can be reduced by ensuring the adhesive layer 31, in which the micro capsules are mixed, to have a high resistance to heat.

In the case of the protective tape 3 having the surface active agent-containing adhesive layer 31, a self-peeling backing material film 33 comprised of an about 40 μm thick thermally shrinkable polyolefine fiber is used in combination with the surface active agent-containing adhesive layer 31. At this surface active agent-containing adhesive layer 31, the surface active agent is dissolved by soaking the tape in hot water of a temperature of 70° to 80° C. so that the adhesive strength of the adhesive layer 31 can be reduced. Further, peeling-off with shrinking can be achieved at 70° to 80° C. by combining this kind of surface active agent containing type of adhesive layer 31 and the self-peeling backing material film 33 described previously.

The thickness of the adhesive layer 31 is set to be equal to or greater than the thickness of the ink marks 2, as was the case for the first embodiment. The ink marks 2 therefore become buried within the adhesive layer 31, as shown in FIG. 1C and the surface of the self-peeling backing material film 33 is made flat, as shown in FIG. 3A. Also, an adhesive layer 31 remains between the ink marks 2 and the self-peeling backing material film 33 by making the adhesive layer 31 thicker than the ink marks 2. The adhesive layer 31 is then used as a pressure buffer material for the process of grinding the substrate 1.

Next, as shown in FIG. 3B, the process of grinding the lower surface 1b of the substrate 1 is carried out. In this grinding process, the lower side 1b of the substrate 1 is ground by applying pressure to a grinding wheel (not shown in the drawings) from the lower side 1b of the substrate 1 with the protective tape, which is attached to the surface of the substrate 1, being set under.

At this time, pressure is uniformly applied to the substrate 1 because the surface of the protective tape 3 is flat. Further, pressure concentration at the portions for the ink marks 2 can be relieved by the adhesive layer 31 between the ink marks 2 and the self-peeling backing material film 33 when the adhesive layer 31 is thicker than the ink marks 2.

This means that grinding of the lower surface can be carried out without cracking or breaking off even if ink marks 2 are applied.

Next, in this second embodiment, the dicing and ultra-violet irradiation curing processes shown in FIG. 3C are proceeded with without peeled off the protective tape 3 attached to the surface 1a of the substrate 1.

Here, transportation to the dicing apparatus (not shown in the drawings) is carried out with the protective tape 3 attached and full-cutting is carried out along the scribe lines 41 with the dicing tape 4 stuck on. The substrate 1 is therefore divided into a number of members 10 with the protective tape 3 still attached. After the dicing is completed, the adhesive layer 31 is hardened by irradiation with, for example, approximately 200 mJ/cm² of ultra-violet light and the adhesive strength is lowered.

By applying the ultra-violet curing adhesive layer 31, the protective tape 3 can be peeled off in later processes without any residual adhesive and washing becomes unnecessary. The hardening by ultra-violet irradiation may be carried out before the silver paste curing following the die bonding. This is effective in the case where the adhesive strength is required to be maintained in order to prevent the protective tape from peeling-off that may occur depending on the chip-size or the kind of die bonder.

It is not necessary to carry out hardening through irradiation with ultra-violet rays after dicing when a thermal foam peeling layer or surface active agent-containing layer is used as the adhesive layer 31.

Next, the process for taking out only non-defective members of the divided members 10 is carried out, as shown in FIG. 4A. Here, the ink marks 2 are detected by an image processing device employing a CCD camera etc. Only non-defective members of the members 10 without ink marks 2 applied are then raised up by a raising pin 51 and then held up by vacuum suction using a collet 5. The surfaces of the members 10 are not damaged or attached with dust as a result of coming into contact with the collet 5 because the protective tape 3 is still attached to the surfaces of the members 10.

Next, the die bond and protective tape for the taken out members 10 is taken off, as shown in FIG. 4B.

The members taken out by the collet 5 (refer to FIG. 4A in the previous process are then mounted on a mounting frame 6 such as a lead frame via silver paste (not shown in the drawings).

After the die bonding, hot air of a temperature of about 100° to 150° C. is blown so that the self-peeling backing material film 33 peels off by itself due to thermal shrinking and is removed.

For example, in the case of the self-peeling backing material film 33, which thermally shrinks and peels, shrinks when heated for five to ten seconds at a temperature of 80° to 100° C. to cause self-peeling. Further, in the case of the thermal foam peeling type, foaming material such as expandable gas enclosed micro capsules within the adhesive layer 31 foams due to heating for one minute at a temperature of about 100° C. This lowers adhesive strength as a result to cause self-peeling. It is also possible for the self-peeling of the protective tape 3 to be carried out at the same time when the members 10 are heated for curing the silver paste.

It becomes therefore possible to easily remove the protective tape 3 by its self-peeling even if the substrate 1 has been divided into individual members 10. That is, by using this kind of protective tape 3, the protective tape 3 does not have to be removed until the members 10 have been mounted on a prescribed mounting frame. This provides the greatest possible protection to the surfaces of the members 10 from damage or dust adhesion even during conveyance between each of the processes.

When a protective tape having a surface active agent-containing adhesive layer 31 is used, tape peeling carried out after dicing together with protective tape 3 becomes being facilitated since surface active-agent in the vicinity of the cut surface is dissolved by a large amount of cutting water used during the dicing process. Washing of the members with hot water at a temperature of 70° to 80° C. is then carried out with the dicing tape still being attached so that the backing material film 33 is thermally shrank, self-peels, and is then removed, and the surface active agent-containing adhesive layer 31 on the surfaces of the members 10 is also removed.

In this second embodiment, a description has been given of an example employing a protective tape 3 that self-peels as a result of heating. The present invention, however, is not limited to this and protective tape 3 that self-peel due to other kinds of energy such as optical energy are also possible.

Further, in FIGS. 1 to 4 used in the description of the first and second embodiments, manufacturing conditions were shown where a silicon wafer was taken as the substrate 1 for the members 10 comprising device chips. However, the same applies even if an optical glass plate or a quartz glass plate is used as the substrate 1 and members comprised by color filters are manufactured. In this case, the grinding of the lower surface of the substrate 1 can be replaced by polishing of the lower surface.

Moreover, the same also applies even if these embodiments are applied to the manufacture of polysilicon TFT liquid crystal display devices. Here, at the time of forming a TFT for the polysilicon TFT liquid crystal display device, prescribed characteristic evaluations are carried out after a thin film of, for example, polysilicon, plasma nitride or $SiO_2$ etc. formed on the lower surface of a substrate of quartz etc. is removed by etching. These characteristic evaluations are carried out by applying ink marks are applied to defective chips instead of performing map data processing. The lower surface of the quartz glass substrate is then polished to remove the thin film with the protective tape 3 of the aforementioned embodiments being attached to the TFT surface. After this, the protective tape 3 is removed as described above, by which the same merit of improved manufacturing yield, productivity and quality can be obtained as above.

As described above, according to the method of manufacturing members in the present invention, the following results are obtained. That is, according to the present invention, the lower surface of the substrate is ground after characteristic measurements, so that the substrate does not crack or break off due to pin pressure etc. at the time of characteristic measurements even if the substrate is made large and thin.

Further, uniform grinding pressure is applied when the lower surface of the substrate is ground after characteristic measurements by making the adhesive layer for the protective tape thicker than the ink marks applied to defective members, and thus cracking and breaking off of the substrate can be prevented.

Still further, this ink mark method adopted in recording information on unacceptable members allows the information on unacceptable members to be surely transmitted with the transferred substrate.

Moreover, it is possible to easily peel the protective tape in individual member units by using the self-peeling backing material film. As a result of this, it is not necessary to peel off the protective film through the grinding of the lower surface of the substrate, the dividing, converting, and bonding of the members. This provides maximum effect of protection of surfaces of the members from damage or dust adhesion etc.

As a result of this, a plurality of thin members can be reliably produced from a large substrate while giving a large yield.

What is claimed is:

1. A method of manufacturing members, with a plurality of members being formed together on a single substrate and the substrate being cut in such a manner as to be divided into individual members after a characteristic evaluation of the members is carried out, the method of manufacturing comprising the steps of:

carrying out the evaluation of the characteristics and applying ink marks of a prescribed height to surfaces of members deemed to have been defective;

affixing a protective tape having an adhesive layer of a thickness equal to or greater than the height of the ink marks to the surface of the substrate; and cutting the substrate in such a manner as to be divided into individual members after a lower surface of the substrate has been ground or polished.

2. A method of manufacturing members according to claim 1, wherein the adhesive strength of the adhesive layer for the protective tape is smaller than the adhesive strength of the ink marks with respect to the substrate.

3. A method of manufacturing members, with a plurality of members being formed together on a single substrate and the substrate being cut in such a manner as to be divided into individual members after a characteristic evaluation of the members is carried out, the method of manufacturing comprising the steps of:

carrying out the evaluation of the characteristics and applying ink marks of a prescribed height to surfaces of members deemed to have been defective;

affixing a self-peeling protective tape having an adhesive layer of a thickness equal to or greater than the height of the ink marks to the surface of the substrate;

cutting the substrate together with protective tape so as to divide the substrate into individual members after a lower surface of the substrate has been ground or polished with the protective tape affixed; and applying a prescribed energy to each individual member after dividing, in such a manner that the protective tape is made to peel itself off.

4. A method of manufacturing members according to claim 3, wherein the self-peeling protective tape peels itself in response to thermal energy.

5. A method of manufacturing members according to claim 1, wherein the adhesive layer of the protective tape is of an ultra-violet curing tape.

6. A method of manufacturing members according to claim 1, wherein the adhesive layer of the protective tape is of a thermal foam peeling type.

7. A method of manufacturing members according to claim 1, wherein the adhesive layer of the protective tape is of a surface active agent-containing type.

* * * * *